Figure 1:
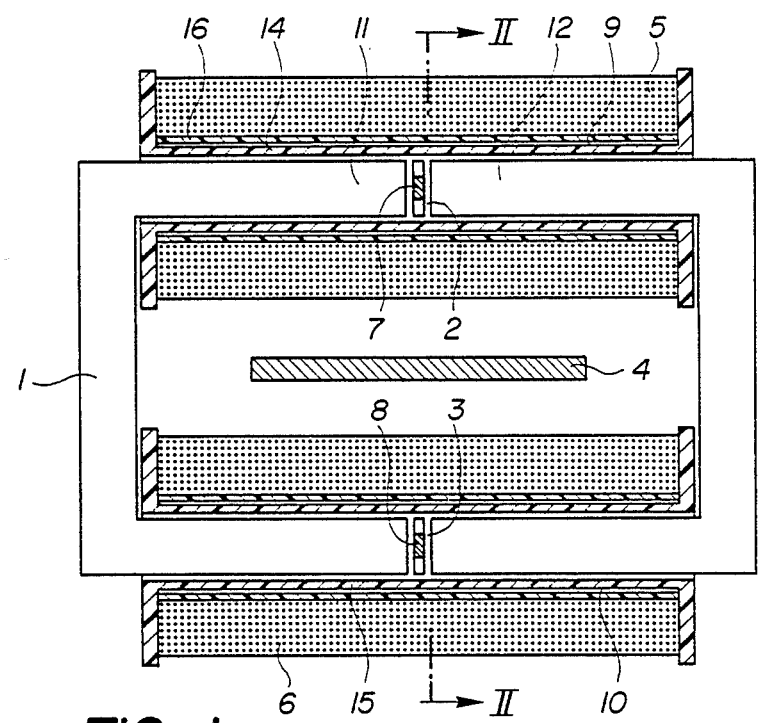

United States Patent [19]

Gudel

[11] Patent Number: 4,947,108
[45] Date of Patent: Aug. 7, 1990

[54] ELECTRIC CURRENT SENSING DEVICE

[75] Inventor: Claude Gudel, Annemasse, France

[73] Assignee: Liaisons Electroniques-Mecaniques LEM SA, Switzerland

[21] Appl. No.: 258,001

[22] Filed: Oct. 14, 1988

[30] Foreign Application Priority Data

Oct. 16, 1987 [CH] Switzerland .................. 4071/87

[51] Int. Cl.⁵ .................. G01R 1/18; G01R 17/06
[52] U.S. Cl. .................. 324/117 H; 324/99 R; 324/127
[58] Field of Search .......... 324/117 H, 127, 99 R, 324/126; 336/84 R, 84 C

[56] References Cited

U.S. PATENT DOCUMENTS

| | | | |
|---|---|---|---|
| 2,134,589 | 10/1938 | Stanek | 324/126 |
| 2,928,048 | 3/1960 | Postal | 324/99 R |
| 3,885,212 | 5/1975 | Herbert | 324/117 H |
| 4,413,230 | 11/1983 | Miller | 324/127 |
| 4,656,418 | 4/1987 | Boston et al. | 324/127 |
| 4,700,131 | 10/1987 | Miller | 324/117 H |

Primary Examiner—Ernest F. Karlsen
Attorney, Agent, or Firm—Woodard, Emhardt, Naughton, Moriarty & McNett

[57] ABSTRACT

A magnetic circuit is coupled with a primary conductor in which flows the current to be sensed. The magnetic circuit has at least one air gap with a magnetic field detector and is coupled with at least one measuring coil producing a magnetic flux for compensating the flux generated by the primary current. The necessary current in the measuring coil to achieve such flux compensation is a measure for the primary current. A magnetic shielding part is provided in the vicinity of the air gap inside the measuring coil.

8 Claims, 2 Drawing Sheets

ELECTRIC CURRENT SENSING DEVICE

The present invention relates to an electric current sensing device to be used for measuring a relatively high current flowing in a conductor and/or for producing an image thereof. More particularly, the invention relates to a current sensing device of the type comprising at least one magnetic circuit arranged so as to be capable of being coupled with a primary conductor in which flows the current to be sensed, the magnetic circuit having at least one air gap and at least one measuring coil being coupled with the circuit. In such a device, magnetic field detector means are arranged in said air gap and a control circuit associated with a current source has input terminals coupled with said magnetic field detector means, and has output terminals connected to a series connection of said measuring coil and current measuring and/or displaying means.

Current sensing devices of the above type are used for measuring a primary current, the term "measuring" being understood to include all kinds of producing a magnitude representing a measure of the current, such as producing a voltage or a current which follow the instantaneous values of the primary current. Further, the production of an image of the primary current is meant to include all kinds of displaying, recording or memorizing the values of the primary current such as, for example, its instantaneous, maximum and mean values or characteristics of its variations in time. It is understood that the magnitude measured can be used depending on the applications of the present device for controlling or actuating other devices, for instance in regulating or controlling circuits.

The operation of sensing devices of this type is based on the principle of compensation of the magnetic flux generated by the primary current, by a flux generated by the measuring coil under the control of said magnetic field detector means. The current in the measuring coil required to achieve the compensation is a measure for the primary current.

Sensing devices of this type appear to be rather sensitive to the influence of outer magnetic fields which affect, in particular, the magnetic field detector means arranged in the air gap. This results in a risk of disturbance of the operation of the sensing device and in errors in the measure of the primary current which appear to be very important in certain applications.

For a long time, various attempts have been made to overcome this drawback by providing a shielding in various ways, for example by arranging the sensing device in a casing of magnetically permeable material, or by arranging a magnetic screen near the measuring coil. However, it appeared that the presence of such a shielding leads to a distortion of the magnetic field, mainly at the air gap and, accordingly, affected the measure to a substantial degree. It is to be noted that the distance of the shielding from the measuring device is rather limited by the limited space available in most applications and also for economic reasons.

Another attempt consisted in using a magnetic circuit with two air gaps and two magnetic field detectors so as to compensate the effects of an outer magnetic field on both detectors. However, due to the important asymmetry of the outer magnetic fields in most applications, such a solution did not lead to sufficient improvement.

It is an object of the present invention to provide a sensing device of the type mentioned at the beginning in which the effect of outer magnetic fields is considerably reduced and which provides a highly precise measure of the current in a wide frequency range, extending from a continuous current up to frequencies of more than 100 kHz In accordance with the invention, the present sensing device comprises a magnetic shielding part arranged inside the measuring coil in the vicinity of the air gap, so as to surround substantially the whole cross section of the magnetic circuit portions forming said air gap. It has been found, surprisingly, that such a shielding part located inside the measuring coil, although dimensioned in order to sufficiently protect the magnetic field detector means against outside magnetic fields, does not affect the good operation of the sensing device, and even leads to a substantial improvement of the measuring precision.

According to a preferred embodiment of the invention, the shielding part is insulated from at least one of the magnetic circuit portions forming the air gap by a layer of a magnetic material arranged between said shielding part and said portion of the magnetic circuit, the shielding part thus forming a magnetic shunt of the air gap without short-circuiting the same. The shielding part can be a sheet of a very small thickness with respect to the dimensions of the cross-section of the magnetic circuit portions forming the air gap, and it preferably extends over a length substantially equal to that of the measuring coil inside which it is arranged.

Figure 2:
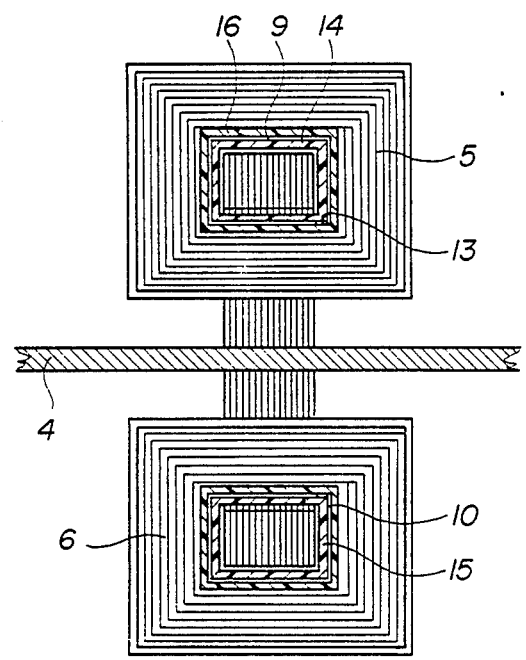
Figure 3:
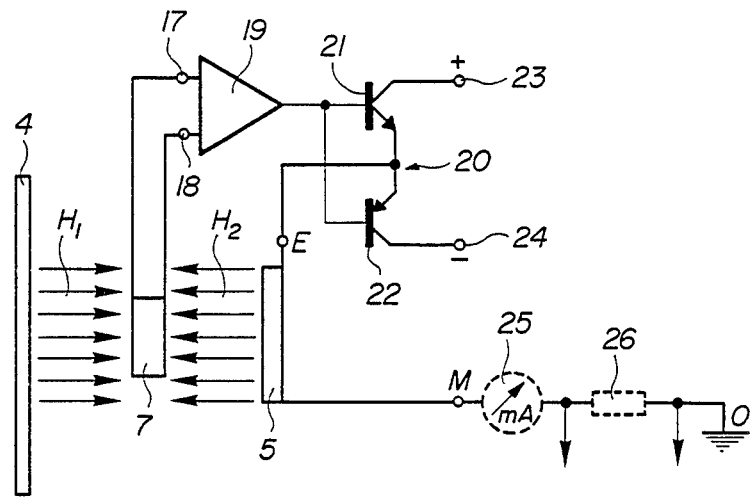

Further features and advantages of the device according to the present invention will appear more clearly from the following description, given by way of example, of a preferred embodiment illustrated in the attached drawings in which FIG. 1 is a partly sectional view of a sensing device according to the invention, seen in the direction of a primary conductor, but shown without the electric circuit and the casing of the sensing device, FIG. 2 is a sectional view along line II—II of FIG. 1, FIG. 3 is a schematic diagram of the basic electric circuit a sensing device as concerned by the invention.

The sensing device shown in FIGS. 1 and 2 comprises a magnetic circuit 1 of generally rectangular shape which has two air gaps 2 and 3 provided in opposite portions of the magnetic circuit with respect to a primary conductor 4. This primary conductor shown in cross section in FIG. 1 extends through the inner space of the magnetic circuit, thus generating therein a magnetic field when a primary current flows in said conductor.

At the location of each air gap 2 and 3, electric measuring coils 5 and 6 are arranged on corresponding portions of the magnetic circuit, these coils being each connected to a control circuit associated with a current source, as will be described hereafter in relation with FIG. 3. Magnetic field detector means 7 and 8, such as Hall effect detectors, are lodged, respectively, inside the air gaps 2 and 3 as shown in FIG. 1.

Referring to the electric diagram of FIG. 3, the primary conductor 4, coupled with the magnetic circuit (not shown in FIG. 3), produces therein a magnetic field $H_1$. The sensing device corresponding to the diagram of FIG. 3 is equipped with only one measuring coil and, accordingly, has only one air gap and one magnetic field detector lodged therein. The measuring coil, shown as coil 5 in FIG. 3, is supplied with a measuring current, so as to produce a magnetic field $H_2$ in the opposite direction of field $H_1$. The magnetic field detector, such as Hall effect detector 7, produces an output signal which is applied to control circuit terminals 17,18. The control circuit comprises, in particular, an amplifier 19 and a measuring current supply circuit 20, including a pair of transistors 21,22 connected in series between current source terminals 23 and 24. The output of amplifier 19 is connected to control electrodes of transistors 21,22, the emitters of which are connected together to a first terminal E of the measuring coil 5. The second terminal M of that coil is connected through a current measuring device 25 and/or a measuring resistor 26 of low resistance, to the ground of the device represented by terminal O.

When a primary current is flowing in conductor 4, the Hall effect detector 7 detects the difference between the fields $H_1$ and $H_2$ and provides a control signal which is used to control the measuring current in coil 5, so as to bring said difference to zero. The current measured between terminals M and O therefore represents at each moment the value of the primary current, thus providing or allowing to produce an image thereof.

FIGS. 1 and 2 show a preferred arrangement and shape of shielding parts 9 and 10 which are made, in this example, from a sheet of a material of high magnetic permeability, such as mumetal, bent around two portions of the magnetic circuit, such as 11,12, forming one of the air gaps. A longitudinal slit 13 shown on FIG. 2 is provided between the edges of this bent sheet part to avoid the forming of a closed electric circuit in the transverse direction of portions 11,12 of the magnetic circuit and the eddy current losses which would result therefrom. Furthermore, a magnetic insulation is provided between the lateral surfaces of said portions of the magnetic circuit forming the air gap and the shielding sheet, so as to avoid a magnetic short circuit of the air gap, while providing a certain magnetic coupling between circuit 1 and parts 9 and 10. This insulation is realized, for example, by the carcases or bodies 14,15 of the measuring coils, which bodies are made of an amagnetic material, such as a suitable plastic material. Furthermore, an insulating and mechanically protecting sheet 16 is arranged between the shielding part and the windings of the coils.

The shielding parts 9 and 10, the thickness of which can be very small as compared to the transversal dimensions of the magnetic circuit 1 and which preferably extend over a length substantially equal to that of the coils in which they are placed, protect the magnetic field detectors arranged inside the air gaps from the influence of outer magnetic fields. It is to be noted that similar sheets, arranged outside the measuring coils, lead to a distortion of the magnetic field in the air gaps of the magnetic circuit and, consequently, to substantial measuring errors of the sensing device. It appears, inexpectedly, that the arrangement of the shielding parts inside the measuring coils leads to a substantial improvement of the measuring precision. It seems that this effect is the consequence of the coupling between the shielding parts and the measuring coils, by which the parts 9 and 10 participate, in the present arrangement, to the compensation process, since a well-defined fraction of the magnetic fluxes, which result from the primary current on the one hand, and from the measuring currents in the measuring coils on the other hand, passes through these shielding parts. It appears, in particular, that the error represented by the difference between the intensity of the primary current and the intensity of the measuring current multiplied by the number of turns of the windings of the measuring coils, is not only extremely small at direct current and at low technical frequencies, but is also considerably reduced at higher frequencies, namely up to frequencies over 100 kHz. Accordingly, a sensing device is provided, in which the transmission band extends from 0 to more than 100 kHz. This feature is of a great importance for all applications in which the primary current is subject to transitions within very short periods of time and the frequency spectrum of which is therefore rich in harmonics. The precision with which the measuring current follows the variations of the primary current up to the fastest variations is primordial, for example in the case of a regulation or a control of the primary current as a function of the measuring current.

I claim:

1. An electric current sensing device to be used for measuring a relatively high current flowing in a conductor and/or for producing an image thereof, comprising at least one magnetic circuit capable of being magnetically coupled with said primary conductor and having at least one air gap, at least one measuring coil coupled with said magnetic circuit, magnetic field detector means arranged inside said air gap, a control circuit and an associated current source having input terminals coupled with said magnetic field detector means, and having output terminals connected to a series connection of said measuring coil and current measuring and/or displaying means, said sensing device further comprising at least one magnetic shielding part arranged inside said measuring coil in the vicinity of said air gap, so as to surround substantially the whole cross section of the magnetic circuit portions forming said air gap.

2. A device as claimed in claim 1, wherein said shielding part is insulated from at least one of said magnetic circuit portions forming the air gap, by a layer of an amagnetic material arranged between said shielding part and said portion of the magnetic circuit.

3. A device as claimed in claim 1, wherein said shielding part is formed by at least one sheet member of a very small thickness with respect to the dimensions of the cross section of the magnetic circuit portions forming the air gap, and is bent around these portions.

4. A device as claimed in claim 2, wherein said shielding part is formed by at least one sheet member of a very small thickness with respect to the dimensions of the cross section of the magnetic circuit portions forming the air gap, and is bent around these portions.

5. A device as claimed in claim 1, wherein said shielding part extends over a length substantially equal to that of the measuring coil inside which it is arranged.

6. A device according to claim 2, wherein said shielding part extends over a length substantially equal to that of the measuring coil inside which it is arranged.

7. A device according to claim 3, wherein said shielding part extends over a length substantially equal to that of the measuring coil inside which it is arranged.

8. A device according to claim 4, wherein said shielding part extends over a length substantially equal to that of the measuring coil inside which it is arranged.

* * * * *

UNITED STATES PATENT AND TRADEMARK OFFICE
CERTIFICATE OF CORRECTION

PATENT NO. : 4,947,108

DATED : August 7, 1990

INVENTOR(S) : Claude Gudel

It is certified that error appears in the above-identified patent and that said Letters Patent is hereby corrected as shown below:

In column 2, line 21, please change the words "a magnetic" to --an amagnetic--.

Signed and Sealed this

Fourteenth Day of January, 1992

Attest:

HARRY F. MANBECK, JR.

*Attesting Officer*      *Commissioner of Patents and Trademarks*